(12) United States Patent
Morioka

(10) Patent No.: US 8,283,678 B2
(45) Date of Patent: Oct. 9, 2012

(54) OPTICAL MODULE

(75) Inventor: Shimpei Morioka, Saitama (JP)

(73) Assignee: Enplas Corporation, Saitama (JP)

( * ) Notice: Subject to any disclaimer, the term of this patent is extended or adjusted under 35 U.S.C. 154(b) by 194 days.

(21) Appl. No.: 12/850,767

(22) Filed: Aug. 5, 2010

(65) Prior Publication Data

US 2011/0057204 A1   Mar. 10, 2011

(30) Foreign Application Priority Data

Aug. 7, 2009   (JP) .................................. 2009-184335

(51) Int. Cl.
*H01L 27/15*   (2006.01)
*G02B 61/42*   (2006.01)

(52) U.S. Cl. ...................... 257/82; 257/E33.077; 385/47
(58) Field of Classification Search .................... 257/84, 257/180, E33.077, 80, 82, 99; 385/39, 47, 385/48

See application file for complete search history.

(56) References Cited

U.S. PATENT DOCUMENTS 6,959,133 B2 * 10/2005 Vancoill et al. ................. 385/47

FOREIGN PATENT DOCUMENTS

| JP | 2006-520491 A | 9/2006 |
| JP | 2008-151894 A | 7/2008 |
| WO | 2004-083926 A | 9/2004 |

* cited by examiner

*Primary Examiner* — A. Sefer
*Assistant Examiner* — Nikolay Yushin
(74) *Attorney, Agent, or Firm* — Kubotera & Associates, LLC

(57) ABSTRACT

An optical module can reliably provide monitor light and can facilitate manufacturing by reducing the number of lens surfaces. Based on a surface shape of each first lens surface (14), the relationship in length between the optical path length of the second optical path and the optical path length of the first optical path after reflecting/transmission surface (17) and whether or not second lens surfaces are formed in second surface (4b) based on this relationship in length, the spot diameter of light of each light emitting element (7) to be coupled to the end surface of each optical fiber (3) is made narrower than a spot diameter of monitor light to be coupled to each light receiving element (8).

6 Claims, 6 Drawing Sheets

OPTICAL MODULE

CROSS REFERENCE TO RELATED APPLICATIONS

The disclosure of Japanese Patent Application No. 2009-184335, filed on Aug. 7, 2009, including the specification, drawings and abstract, is incorporated herein by reference in its entirety.

TECHNICAL FIELD

The present invention relates to an optical module. To be more specific, the present invention relates to an optical module that is adequate to optically couple a plurality of light emitting elements and end surfaces of a plurality of optical fibers.

BACKGROUND ART

Recently, as a technique of transmitting signals inside a system apparatus, between system apparatuses or between optical modules at high speed, so-called optical interconnection is widely adopted. Here, optical interconnection refers to a technique of handling optical components as if they were electrical components, and mounting them on, for example, a mother board or circuit substrate used for a personal computer, vehicle, optical transceiver and the like.

An optical module used for such optical interconnection has various uses for internal connection of a media converter or switching hub, connection of components inside an apparatus or between apparatuses such as optical transceivers, medical equipment, test devices, video systems and high speed computer clusters.

With an optical module of this type, communication information is transmitted through optical fibers by coupling light which includes communication information and which has been emitted from light emitting elements, to the end surfaces of optical fibers through lenses.

Here, conventionally, it has been pointed out that, with the optical module of this type, the output performance of light emitting elements for emitting light changes due to the influence of, for example, temperature, and therefore there is a risk of disrupting adequate transmission of communication information.

So far, proposals have been made as to various techniques for monitoring light (particularly the intensity or the amount of light) emitted from light emitting elements in order to stabilize the output performance of the light emitting elements.

For example, Patent Literature 1 discloses an optical element that has, around the lens surface (i.e. transmission surface part), a reflecting surface (i.e. reflecting surface part) for reflecting part of light emitted from light emitting elements toward light receiving elements.

Further, Patent Literature 2 discloses an optical module that reflects part of light emitted from laser sources as monitor light by a multi-interface beam splitter, and receives reflected monitor light in a detector.

CITATION LIST

Patent Literature

PTL 1: Japanese Patent Application Laid-Open No. 2008-151894
PTL 2: Japanese Patent Application Laid-Open No. 2006-520491

SUMMARY OF INVENTION

Technical Problem

However, the configuration disclosed in Patent Literature 1 has a problem of making effective application of multi-channel optical communication difficult to realize this multi-channel optical communication in a compact configuration. That is, in recent years, as small optical components for realizing multi-channel optical communication, a demand for lens arrays in which a plurality of lenses are aligned in a predetermined direction of alignment is increasing. With a lens array of this type, a light emitting apparatus, in which a plurality of light emitting elements are aligned, is arranged such that each light emitting element is arranged to face each lens surface on the incidence side of the lens array, a plurality of optical fibers are arranged to face each lens surface on the emission side of the lens array and light emitted from each light emitting element is optically coupled to the end surface of each optical fiber by each lens of the lens array to perform multi-channel optical communication (i.e. transmission). Further, it is very important even for this lens array to monitor light emitted from light emitting elements in order to secure stability in optical communication. However, with this lens array, not only each lens is formed to have a very small diameter, but also the pitches between lenses that are adjacent to each other are made very narrow, and, therefore, it is difficult to form, around lenses of the lens array, a reflecting surface for reflecting monitor light by applying the configuration disclosed in Patent Literature 1 to the lens array.

Further, the configuration disclosed in Patent Literature 2 has multiple lenses including a collimator lens facing a laser source, lenses facing optical fibers and a focusing lens facing an optical detector, and therefore there is a problem that it is very difficult to manufacture this configuration. Furthermore, in relation to this, with the configuration disclosed in Patent Literature 2, the lens facing the laser source is made a collimating lens, and so, to prevent the spot diameter of light to be coupled to an optical detector and optical fibers, from being too larger, it is necessary to provide lenses that converge light emitted from the laser light sources, in the middle to an optical path from the collimating lens to the optical detector and in the middle of an optical path from the collimating lens to the optical fibers, and, therefore, it is difficult to reduce the number of lenses.

It is therefore an object of the present invention to provide an optical module that can reliably provide monitor light and can be manufactured easily by reducing the number of lens surfaces.

Solution to Problem

Features of the optical module according to the present invention lie in that the present invention includes: a photoelectric converting device in which a plurality of light emitting elements that emit light are aligned and formed and in which at least one light receiving element that receives monitor light for monitoring light emitted from at least one of the light emitting elements is formed; a plurality of optical fibers which match the light emitting elements; and a lens array which is arranged between the photoelectric converting device and the optical fibers, and which optically couples the light emitting elements and end surfaces of the optical fibers, includes: in a first surface of the lens array facing the photoelectric converting device, a plurality of first lens surfaces which are formed to align in a predetermined direction of alignment matching the light emitting elements, which allow incidence of light emitted from the light emitting elements and the number of which is the same as the light emitting elements; in the lens array, a first concave part which is recessed and formed such that the first concave part is positioned on a first optical path connecting the light emitting elements and the end surfaces of the optical fibers; a reflecting/transmission surface which forms part of a lateral surface in the first concave part, which reflects light incident on the first lens surfaces, at a predetermined reflectivity and allows transmission of the light at a predetermined transmittance while refracting the light toward the first optical path and which, upon the transmission, branches light incident on at least one of the first lens surfaces, from the first optical path as the monitor light and reflects the monitor light toward a second optical path leading to the light receiving elements; in the lens array, a second concave part which is recessed and formed such that second concave part is positioned on the second optical path; an emitting surface which forms part of a lateral surface of the second concave part and which emits the monitor light incident from the reflecting/transmission surface, to an inside of space formed by the second concave part; and a first total reflecting surface which is formed in other part of a lateral surface in the second concave part and which totally reflects the monitor light emitted from the emitting surface, toward the light receiving elements, and light incident on the first lens surfaces after being transmitted through the reflecting/transmission surface toward the first optical path is produced so as to be emitted from a second surface facing the end surfaces of the optical fibers in the lens array, to the end surfaces of the optical fibers; a surface shape of the first lens surfaces is formed in a surface shape which converges light incident from each of the light emitting elements; the emitting surface is formed in a flat surface; and, based on the surface shape of the first lens surfaces, a relationship in length between an optical path length of the second optical path and an optical path length of the first optical path after the reflecting/transmission surface, and whether or not a plurality of second lens surfaces which emit light incident on the first lens surfaces toward the end surfaces of the optical fibers while converging the light, are formed in the second surface, a spot diameter of light emitted from each of the light emitting elements to be coupled to each of the end surfaces of the optical fibers is formed narrower than a spot diameter of the monitor light to be coupled to the light receiving elements.

Advantageous Effects of Invention

The present invention can reliably provide monitor light and can easily be manufactured by reducing the number of lens surfaces.

DESCRIPTION OF EMBODIMENTS

Embodiment 1

Hereinafter, an optical module according to Embodiment 1 of the present invention will be explained with reference to FIG. 1 to FIG. 5.

Figure 1:
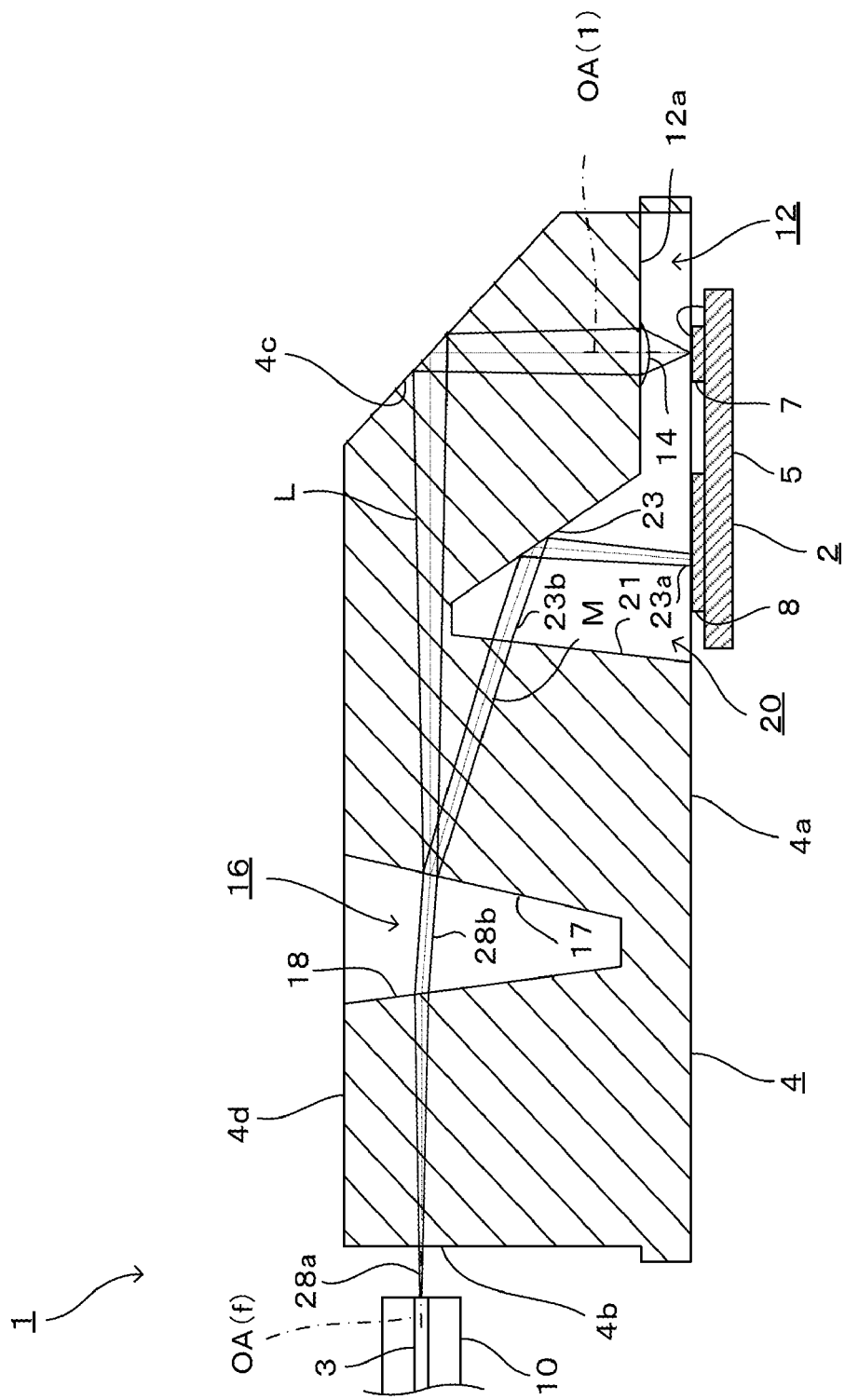
FIG. 1 is a schematic configuration diagram showing an optical module according to Embodiment 1 of the present invention, and a vertical cross-section of a lens array.

As shown in FIG. 1, optical module 1 according to the present embodiment is mainly formed with photoelectric converting device 2, optical fibers 3 and lens array 4 arranged between these photoelectric converting device 2 and optical fibers 3. Note that, as shown in FIG. 1, photoelectric converting device 2 faces lens array 4 from below in FIG. 1, and optical fibers 3 face lens array 4 from the left in FIG. 1.

Figure 2:
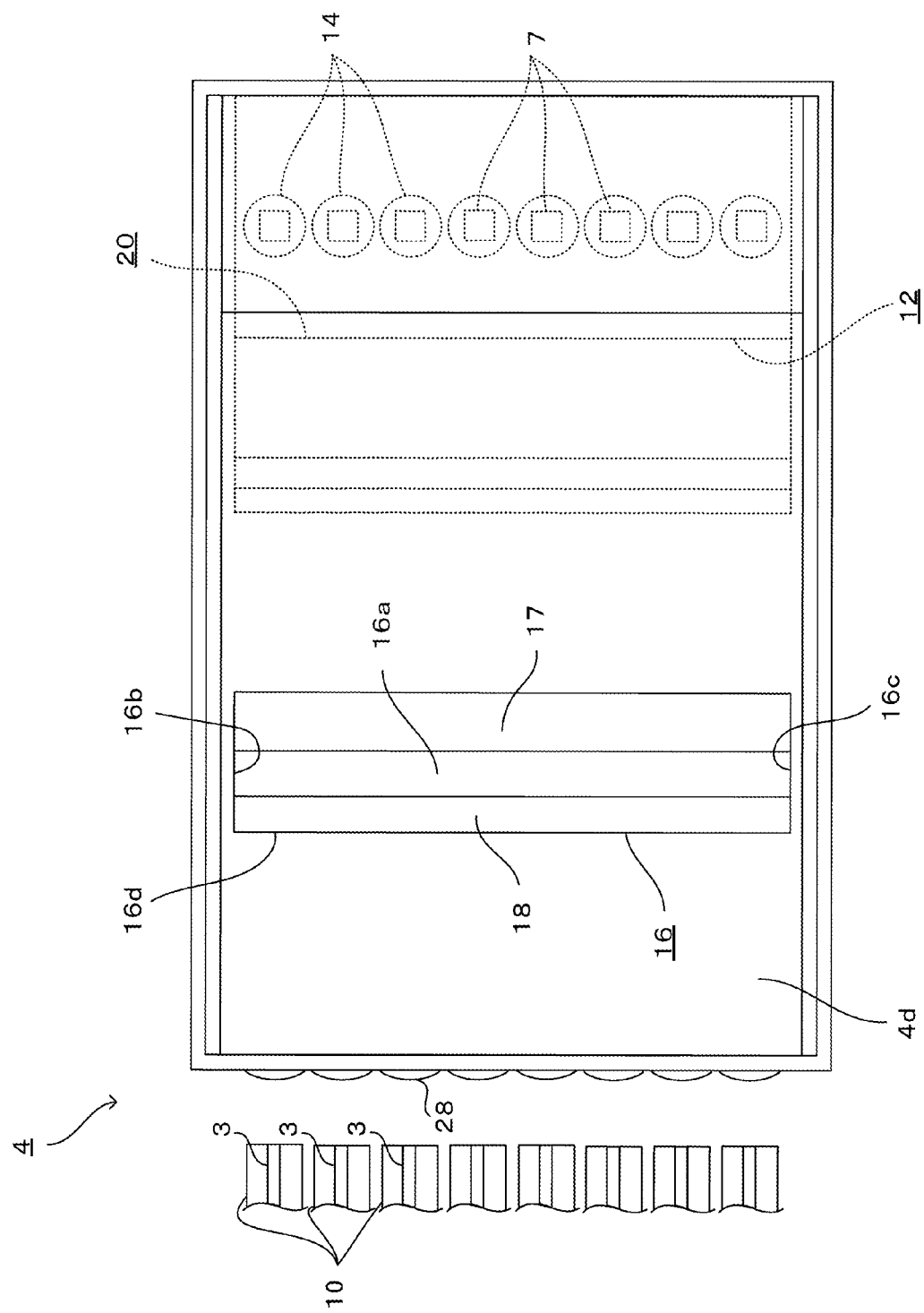
FIG. 2 is a plan view showing a lens array of an optical module according to an embodiment of the present invention.

First, photoelectric converting device 2 will be explained in detail. As shown in FIGS. 1 and 2, photoelectric converting device 2 has, in the surface of semiconductor substrate 5 facing lens array 4, a plurality of (i.e. eight) light emitting elements 7 that emit laser light L (i.e. emit light with a spot diameter of 28$a$ and an optical path length 28$b$) in the vertical direction (i.e. in the upper direction in FIG. 1) with respect to this surface. Light emitting elements 7 form a vertical cavity surface emitting laser ("VCSEL"). Note that, in FIG. 1, light emitting elements 7 are formed and aligned along the vertical direction in FIG. 1. Further, in the positions near the left side of each light emitting element 7 in FIG. 1 on the surface of semiconductor substrate 5 facing lens array 4, the same number of light receiving elements 8 as light emitting elements 7 are formed. Each light receiving element 8 receives monitor light M (with a spot diameter 23$a$ and an optical path length 23$b$) that is used to monitor the output (for example, the intensity or amount of light) of laser light L emitted from each light emitting element 7. Note that light receiving elements 8 are aligned and formed in the same direction as light emitting elements 7, and the positions of elements 7 and 8 corresponding to each other match in the direction of alignment. That is, light receiving elements 8 are formed at the same pitches as light emitting elements 7. These light receiving elements 8 may be photo-detectors. Further, the same number of light receiving elements 8 as the number of light emitting elements 7 need not be provided, and at least one light receiving element 8 needs to be provided. Furthermore, although not shown, photoelectric converting device 2 is connected with a common control circuit that controls the output of laser light L emitted from light emitting elements 7 based on monitor light M received in light receiving elements 8. Photoelectric converting device 2 is arranged to face lens array 4 such that part of semiconductor substrate 5 facing lens array 4 abuts on the abutting surface (not shown) of lens array 4. Then, this photoelectric converting device 2 is attached to lens array 4 by a common fixing means.

Next, optical fibers 3 will be explained in detail. In association with light emitting elements 7 and light receiving elements 8, the same number of optical fibers 3 according to the present embodiment as these light emitting elements 7 and light receiving elements 8 are provided. Each optical fiber 3 is aligned and formed along the vertical direction in FIG. 1. Further, each optical fiber 3 is aligned at the same pitch as light emitting elements 7. Furthermore, each optical fiber 3 is attached to lens array 4 by a common fixing means, in a state where part on the end surface side (hereinafter simply "end surface") facing this lens array 4 is held inside bulk multicore connector 10.

Then, in a state where lens array 4 is arranged between photoelectric converting device 2 and optical fibers 3, lens array 4 optically couples each light emitting element 7 of photoelectric converting device 2 and the end surface of each optical fiber 3.

Figure 3:
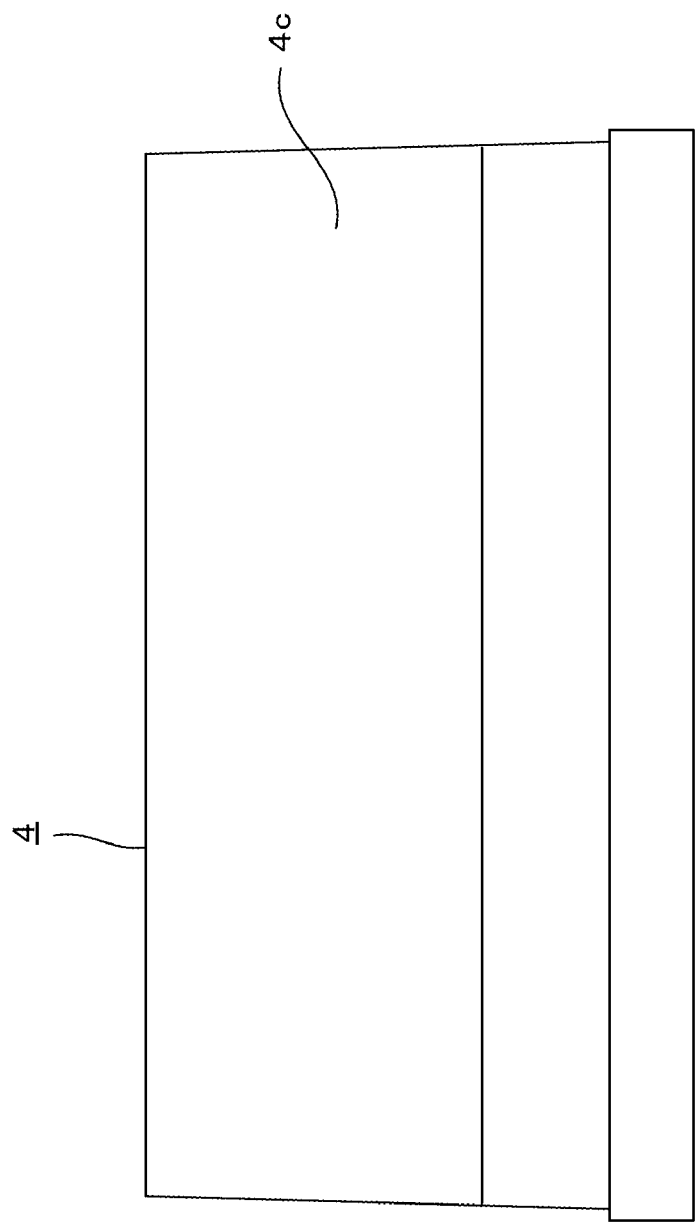
FIG. 3 is a right-side view of FIG. 2.
Figure 4:
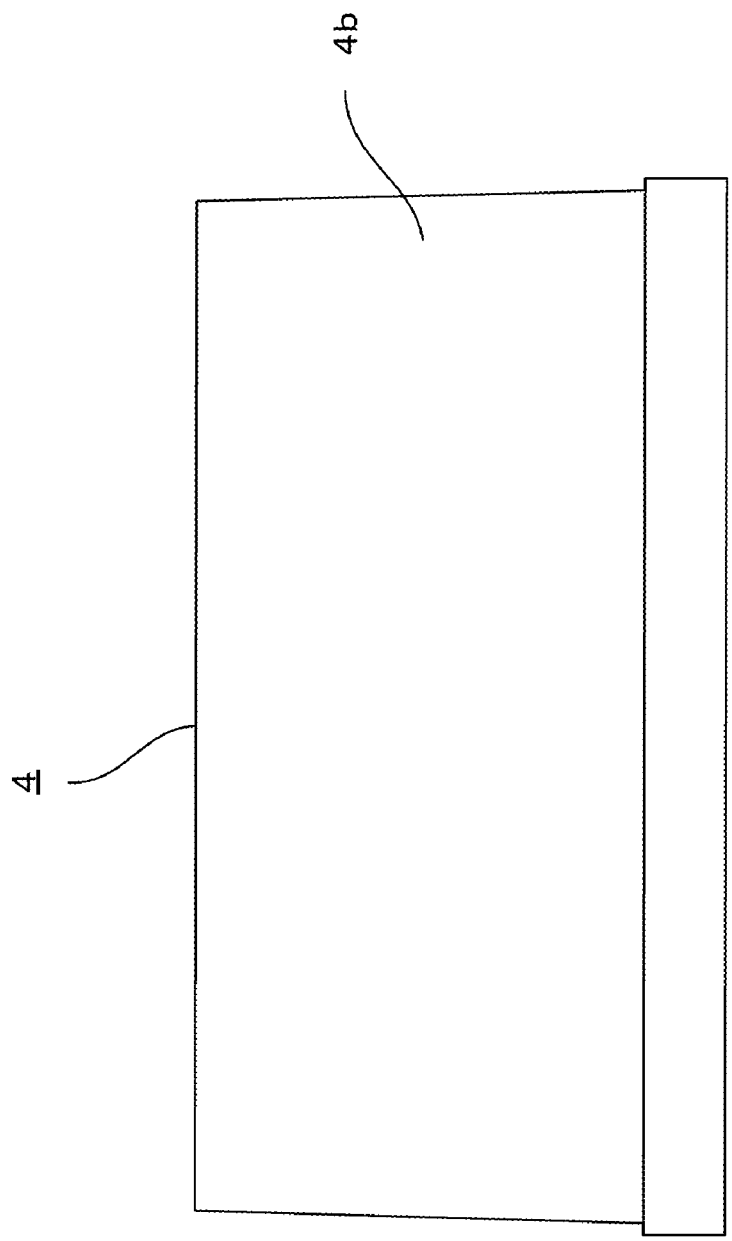
FIG. 4 is a left-side view of FIG. 2.

Next, lens array 4 will be explained in detail. As shown in FIG. 1, lens array 4 is formed such that its outer shape of the vertical cross-section has virtually a trapezoidal shape. Further, as shown in FIG. 2, the planar shape of lens array 4 is formed in a rectangular shape. Furthermore, as shown in FIG. 3 and FIG. 4, the lateral shape of lens array 4 is formed in virtually an isosceles trapezoidal shape. This lens array 4 is integrally formed using, for example, a translucent material such as a resin material or glass material. In this case, if a resin material (for example, polyetherimide) is selected as a material for lens array 4, it is possible to manufacture lens arrays 4 and optical modules 1 efficiently at low cost.

Figure 5:
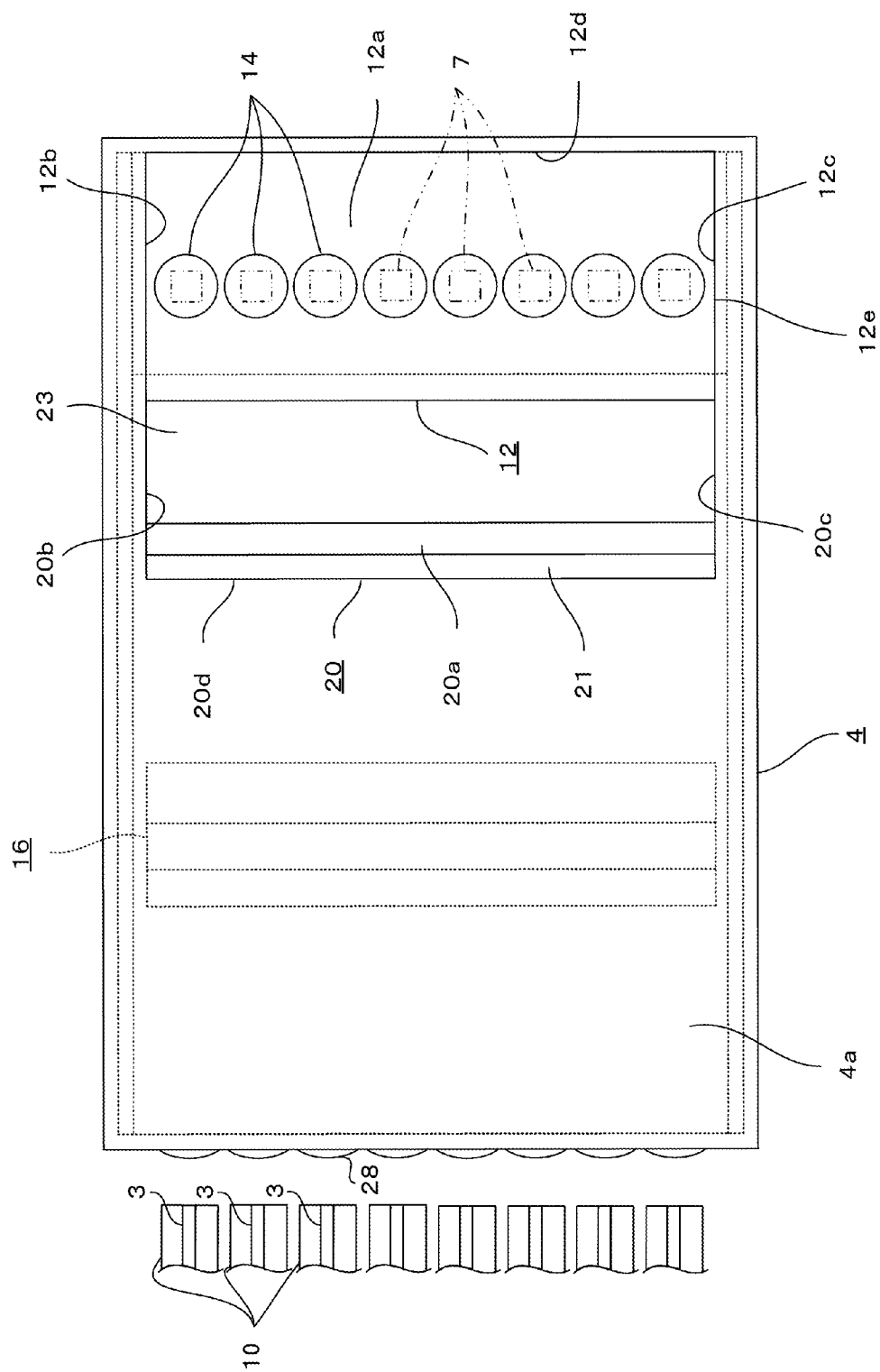
FIG. 5 is a lower surface view of FIG. 2.

As shown in FIG. 1, FIG. 2 and FIG. 5, in the position near the right end part of lower end surface 4a of lens array 4 in FIG. 1, counterbore part 12 of a rectangular parallelpiped shape is indented. Bottom surface 12a of counterbore part 12 is formed in parallel to lower end surface 4a of lens array 4. Then, as shown in FIG. 1, photoelectric converting device 2 faces bottom surface 12a of counterbore part 12 from below in FIG. 1. That is, with the present embodiment, bottom surface 12a of counterbore part 12 is the first surface of lens array 4 that faces photoelectric converting device 2. Then, in bottom surface 12a of counterbore part 12, the same number of multiple (i.e. eight) first lens surfaces (i.e. convex lens surfaces) 14 of a circular shape from a plan view as light emitting elements 7 are formed to align in the predetermined direction of alignment matching light emitting elements 7, that is, the same direction as the direction in which light emitting elements 7 are aligned (i.e. the vertical direction in FIG. 1 and the longitudinal direction in FIG. 2 and FIG. 5). These plurality of first lens surfaces 14 are formed at the same pitch as light emitting elements 7, and optical axis OA(1) on each first lens surface 14 matches the center axis of laser light L that is parallel to each other and that is emitted from light emitting elements 7. Further, optical axis OA(1) of each first lens surface 14 is parallel to the plane normal line in bottom surface 12a of counterbore part 12. On each first lens surface 14, laser light L emitted from each light emitting element 7 matching each first lens surface 14 is incident, and each first lens surface 14 allows each incident laser light L to transmit and travel into lens array 4.

Then, according to the present embodiment, the surface shape of each first lens surface 14 is formed in a surface shape that converges each laser light (i.e. light flux) L incident from each light emitting element 7 side. This surface shape only needs to be defined by, for example, the power of first lens surface 14. Accordingly, with the present embodiment, it is possible to converge laser light L of each light emitting element 7 on first lens surface 14 and then allow laser light L to travel into lens array 4.

Further, as shown in FIG. 1 and FIG. 3, in the position of lens array 4 from which laser light L transmits to each first lens surface 14, that is, in the upper right end part of lens array 4 in FIG. 1, second total reflecting surface 4c is formed as if the corner part of lens array 4 is cut off. Second total reflecting surface 4c faces each first lens surface 14 from the upper direction in FIG. 1. As shown in FIG. 1, second total reflecting surface 4c is formed in an inclined surface having an angle of 45 degrees in the counter-clockwise direction in FIG. 1, based on the horizontal direction (i.e. 0 degree) in FIG. 1. On second total reflecting surface 4c formed in this way, each laser light L transmitting through each first lens surface 14 is incident from below in FIG. 1 at an angle of incidence equal to or greater than a critical angle. At this time, thanks to the convergence effect in each first lens surface 14, the diameter of each laser light L upon incidence on this second total reflecting surface 4c is reduced more than each laser light L immediately after laser light L transmits through each first lens surface 14. Then, second total reflecting surface 4c totally reflects each incident laser light L at a right angle toward the left direction in FIG. 1. At this time, thanks to the convergence effect in each first lens surface 14, the diameter of each laser light L immediately after total reflection on this second total reflecting surface 4c is reduced more than each laser light L upon incidence on second total reflecting surface 14c.

Further, as shown in FIG. 1, FIG. 2 and FIG. 5, in the position of lens array 4 toward which laser light L is totally reflected on second total reflecting surface 4c, that is, in the position on the left of second total reflecting surface 4c in FIG. 1, first concave part 16 having virtually an isosceles trapezoidal vertical cross-section is provided. As shown in FIG. 1, first concave part 16 is recessed and formed in upper end surface 4d of lens array 4 in FIG. 1 such that first concave part 16 is positioned on the optical path connecting each light emitting element 7 and the end surface of each optical fiber 3.

As shown in FIG. 1, in first concave part 16, flat reflecting/transmission surface 17 forming part of the lateral surface (i.e. right side surface in FIG. 1) of this first concave part 16 is formed. This reflecting/transmission surface 17 is formed in an inclined surface in which the upper end side and lower end side in FIG. 1 are parallel to the direction of alignment of first lens surfaces 14 and the upper end side is positioned closer to second total reflecting surface 4c than the lower end side, and in which the plane normal line of reflecting/transmission surface 17 is inclined with respect to the direction orthogonal to the direction (i.e. the left direction in FIG. 1) in which each laser light L is totally reflected on second total reflecting surface 4c. On this reflecting/transmission surface 17, each laser light L totally reflected on second total reflecting surface 4c is incident from the right in FIG. 1. At this time, thanks to the convergence effect in each first lens surface 14, the diameter of each laser light L upon incidence on reflecting/transmission surface 17 is reduced more than each laser light L immediately after laser light L is totally reflected on second total reflecting surface 4c. Then, reflecting/transmission surface 17 reflects each incident laser light L at a predetermined reflectivity by Fresnel reflection, and allows each laser light L to transmit at a predetermined transmittance toward the first optical path. At this time, reflecting/transmission surface 17 reflects part of each laser light L (i.e. an amount of light matching the reflectivity) toward the second optical path as monitor light M matching each light emitting element 7. Note that the second optical path refers to an optical path which branches from the first optical path toward light receiving elements 8, in other words, refers to an optical path for monitor light M which starts from reflecting/transmission surface 17 and ends at light receiving elements 8. Note that, in case where lens array 4 is formed only with polyetherimide, reflecting/transmission surface 17 reflects each laser light L having been incident from second total reflecting surface 4c, at a reflectivity of 5.88 [%] (where in the amount of loss of light is −12.3 [dB]), and allows the rest of laser light L to transmit. Further, each laser light L that is allowed to transmit through reflecting/transmission surface 17 is refracted according to Snell's law.

Further, as shown in FIG. 1, in first concave part 16, flat first refracting surface 18 that forms the other part of the lateral surface (i.e. the left side surface in FIG. 1) in first concave part 16 is formed in a position from which laser light L transmits to reflecting/transmission surface 17. This first refracting surface 18 is formed in an inclined surface in which the upper end side and the lower end side in FIG. 1 are parallel to the direction of alignment of first lens surfaces 14 and the upper end side is positioned closer to optical fibers 3 than the lower end side, and the plane normal line of refracting surface 18 is inclined in the direction orthogonal to the direction in which each laser light L is totally reflected on second total reflecting surface 4c. Each laser light L having transmitted through reflecting/transmission surface 17 and traveled inside the space (i.e. air) formed by first concave part 16, is incident on this first refracting surface 18. Then, first refracting surface 18 refracts each incident laser light L and refracts each laser light L according to Snell's law to transmit such that its traveling direction matches optical axes OA(f) in the end surface of each optical fiber 3. Note that, with the present embodiment, the direction in which each laser light L is refracted on first refracting surface 18 is parallel to the direction in which each laser light L is totally reflected on second total reflecting surface 4c.

Further, with the present embodiment, each laser light L refracted on first refracting surface 18 travels inside lens array 4 toward the left direction in FIG. 1, and then is incident on (i.e. arrives at) left end surface 4b of lens array 4 in FIG. 1 as the second surface in lens array 4, from the inside of lens array 4. Here, the plane normal line of left end surface 4b of this lens array 4 is parallel to optical axis OA(f) in the end surface of each optical fiber 3, and therefore each laser light L refracted on first refracting surface 18 is directly incident on left end surface 4b of lens array 4. At this time, thanks to the convergence effect in each first lens surface 14, the diameter of each laser light L upon incidence on left end surface 4b of this lens array 4 is reduced more than each laser light L upon incidence on reflecting/transmission surface 17. Then, each laser light L incident on left end surface 4b of lens array 4 transmits through left end surface 4b so as to be emitted from left end surface 4b toward the end surface of each optical fiber 3. Thus, each laser light L is coupled to the end surface of each optical fiber 3.

Further, as shown in FIG. 1, FIG. 2 and FIG. 5, in the position of lens array 4 toward which each monitor light M travels from reflecting/transmission surface 17, second concave part 20 having virtually a trapezoidal vertical cross-section is provided. As shown in FIG. 1, second concave part 20 is recessed and formed in lower end surface 4a of lens array 4 in FIG. 1 such that second concave part 20 is positioned on the second optical path. Further, second concave part 20 communicates with above-described counterbore part 12 through the right end part in FIG. 1, and, as shown in FIG. 5, these second concave part 20 and counterbore part 12 present an integral concave shape in which the width dimension in the direction of alignment of first lens surfaces 14 is the same.

As shown in FIG. 1, with second concave part 20, second refracting surface 21 as an emitting surface forming part of the lateral surface (i.e. left side surface in FIG. 1) in this second concave part 20 is formed, and each monitor light M having been produced on reflecting/transmission surface 17 and having travelled (i.e. travelled straight) on the second optical path inside lens array 4 is incident from the reflecting/transmission surface 17 side. This second refracting surface 21 is formed in an inclined surface in which the upper end side and the lower end side in FIG. 1 are parallel to the direction of alignment of first lens surfaces 14 and the lower end side is positioned closer to first concave part 16 than the upper end side, and in which the plane normal line of second refracting surface 21 is inclined with respect to an incident direction of each monitor light M. This second refracting surface 21 refracts each monitor light M incident from the reflecting/transmission surface 17 side and refracts each monitor light M according to Snell's law to transmit so that each monitor light M is emitted toward the second optical path inside the space formed by second concave part 20. Note that, in this case, although each monitor light M having been incident on second refracting surface 21 loses light corresponding to Fresnel reflection (by −0.26 [dB] in case where lens array 4 is formed only with polyetherimide), large part of monitor light M is emitted toward the second optical path.

Further, as shown in FIG. 1, in the position to which monitor light M is emitted from second refracting surface 21, second concave part 20 has first total reflecting surface 23 forming the other part of the lateral surface (i.e. the right side surface in FIG. 1) of second concave part 20. As shown in FIG. 1, first total reflecting surface 23 faces second refracting surface 21 in the right direction in FIG. 1, and faces each light receiving element 8 of photoelectric converting device 2 from the upper direction in FIG. 1. With this first total reflecting surface 23, the inclining angle in the counter-clockwise direction in FIG. 1, based on the horizontal direction (i.e. 0 degrees) may be formed greater than the inclining angle of second total reflecting surface 4c, or may be formed as the same angle. Note that the inclining angle of this first total reflecting surface 23 is preferably an inclining angle such that the direction in which monitor light M is totally reflected is parallel to optical axis OA(1) of first lens surface 14. By so doing, it is possible to relax the accuracy to attach photoelectric converting device 2, and improve the efficiency to manufacture optical modules 1. On first total reflecting surface 23 formed in this way, each monitor light M emitted from second refracting surface 21 is incident from the upper left direction in FIG. 1 at an angle of incidence equal to greater than a critical angle. Then, first total reflecting surface 23 totally reflects each incident monitor light M toward each corresponding light receiving element 8. By this means, each monitor light M is coupled to each light receiving element 8. Note that light receiving elements 8 such as photo-detectors can generally detect light at the level of −20 [dB], and therefore the amount of monitor light M is enough to perform detection in light receiving elements 8.

Further, with the present embodiment, as shown in FIG. 1, both left end surface 4b and second refracting surface 21 of lens array 4 are formed in the flat surface, and do not have a lens surface.

Furthermore, with the present embodiment, based on the first to third characteristics (that is, as main factors), the spot diameter 28a (hereinafter referred to as "fiber-side spot diameter") of each laser light L to be coupled to the end surface of each optical fiber 3 is formed narrower than the spot diameter 23a (hereinafter referred to as "monitor-side spot diameter") of each monitor light M.

Here, the first characteristic includes that the surface shape of each first lens surface 14 is formed in a surface shape that can converge each laser light L.

Further, the second characteristic includes the relationship in length between the optical path length 23b of the second optical path and the optical path length 28b of the first optical path after reflecting/transmission surface 17.

Furthermore, the third characteristic includes whether or not the same number of second lens surfaces as first lens surfaces 14 that emit each laser light L toward the end surface of each optical fiber 3 while converging each laser light L are formed in left end surface 4b of lens array 4, and this depends on the above relationship in length in the second characteristic.

Note that the details of the second characteristic according to the present embodiment include that the optical path length 28b of the first optical path after reflecting/transmission surface 17, that is, the optical path length (i.e. air conversion length) from reflecting/transmission surface 17 to the end surface of each optical fiber 3, is formed longer than the optical path length 23b of the second optical path, that is, the optical path length (i.e. air conversion length) from reflecting/transmission surface 17 to each light receiving element 8. Further, the details of the third characteristic according to the present embodiment include that the second lens surfaces are not formed in left end surface 4b of lens array 4 as shown in FIG. 1.

Furthermore, with the present embodiment, the fiber-side spot diameter is formed to be narrower than the monitor-side spot diameter based on these first to third characteristics, so that it is possible to limit the number of lens surfaces while employing a configuration matching the actual design of optical fibers 3 and light receiving elements 8. The reason is as follows.

First, the light receiving surface of light receiving element 8 is generally designed greater than the end surface of optical fiber 3, and the optical coupling efficiency required for light receiving element 8 is substantially relaxed compared to optical fiber 3. Therefore, the maximum allowable diameter of the monitor-side spot diameter is designed wider than the maximum allowable diameter of the fiber-side spot diameter. Accordingly, the relationship in width between the fiber-side spot diameter and the monitor-side spot diameter as in the present embodiment has a negative influence on coupling of monitor light M to light receiving element 8 and coupling of laser light L to the end surface of optical fiber 3. Instead, by allowing the monitor-side spot diameter to widen to some extent, it is possible to relax the accuracy to attach photoelectric converting device 2, and, consequently, this configuration is preferable from the perspectives of facilitating manufacturing of optical modules 1. Accordingly, the configuration of forming the fiber-side spot diameter narrower than the monitor-side spot diameter matches the actual design of optical fibers 3 and light receiving elements 8.

Further, by realizing this configuration based on the first to third characteristics, it is possible to limit the number of lens surfaces. That is, with the present embodiment, laser light L traveling on the first optical path 28b after reflecting/transmission surface 17 can be made converged light that has been subjected to the convergence effect (i.e. the effect in the first characteristics) in first lens surface 14, so that it is possible to gradually reduce the diameter of this laser light L in the process in which laser light L travels on this first optical path after reflecting/transmission surface 17. Hence, as in the second characteristic according to the present embodiment, by making the optical path length 28b of the first optical path after reflecting/transmission surface 17 longer than the optical path length 23b of the second optical path, it is possible to increase the degree of reduction in the diameter of laser light L in the first optical path after reflecting/transmission surface 17, more than the degree of reduction in the diameter of monitor light M in the second optical path. Thus, according to this second characteristic, even if second lens surfaces are not formed in left end surface 4b of lens array 4 (i.e. third characteristic), it is possible to make the fiber-side spot diameter narrower than the monitor-side spot diameter. Further, with the present embodiment, it is possible to substantially converge laser light L which travels on the first optical path after reflecting/transmission surface 17 and monitor light M which travels on the second optical path, on this first lens surfaces 14 when laser light L which becomes these laser light L and monitor light M transmits through first lens surfaces 14. Therefore, as in the present embodiment, even in case of a configuration in which the second lens surfaces are not formed and the lens surfaces for converging monitor light M are not formed on second refracting surface 21, it is possible to design the fiber-side spot diameter and monitor-side spot diameter within maximum allowable diameters (for example, for the fiber-side spot diameter, 50 μm corresponding to the core diameter, and, for the monitor-side spot diameter, 100 μm corresponding to the size of the receiving surface of the light receiving element). Here, to limit the fiber-side spot diameter and monitor-side spot diameter within the maximum allowable diameters, a design to select, for example, specific power of first lens surfaces 14, a specific value of the optical path length 28b of the first optical path after reflecting/transmission surface 17 and a specific value of the optical path length of the second optical path, is necessary. By contrast with this, if at least the first to third characteristics are assumed as preconditions, it is possible to easily provide this design effortlessly. Accordingly, with the present embodiment, even if second lens surfaces are not formed in left end surface 4b of lens array 4 and lens surfaces that converge monitor light M are not formed in second refracting surface 21, a problem does not occur in coupling laser light L to end surfaces of optical fibers 3 and coupling monitor light M to light receiving elements 8.

From these reasons, with the present embodiment, the fiber-side spot diameter is formed narrower than the monitor-side spot diameter based on the first to third characteristics, so that it is possible to limit the number of lens surfaces while employing a configuration matching the actual design of optical fibers 3 and light receiving elements 8.

In addition to the above configuration, with the present embodiment, each light emitting element 8 is arranged in the position closer to first concave part 16 than each light emitting element 7, second total reflecting surface 4c is formed in lens array 4 and second concave part 20 is arranged in the position which is closer to first concave part 16 than each first lens surface 14 and second total reflecting surface 4c and which is off the first optical path that has not reached reflecting/transmission surface 17. By this means, it is possible to form the first optical path that has not reached reflecting/transmission surface 17, such that the first optical path does not cross the second optical path. Consequently, it is possible to avoid interference between laser light L and monitor light M to be coupled to the end surface of each optical fiber 3.

Further, with the present embodiment, first concave part 16 is formed in such a shape that, seen from the plane normal direction of upper end surface 4d of lens array 4 (i.e. from the upper direction in FIG. 1), bottom surface 16a (i.e. lower end surface in FIG. 1) and all lateral surfaces 16b, 16c, 17 and 18 of first concave part 16 are accommodated within the range defined by the outer shape of opening part 16d in first concave part 16. Furthermore, with the present embodiment, second concave part 20 is formed in such a shape that, seen from the plane normal direction of lower end surface 4a of lens array 4 (i.e. from the lower direction in FIG. 1), bottom surface 20a (i.e. upper end surface in FIG. 1) and all lateral surfaces 20b, 20c, 21 and 23 of second concave part 20 are accommodated within the range defined by the outer shape of opening part 20d in second concave part 20. Still further, with the present embodiment, counterbore part 12 is formed in such a shape that, seen from the plane normal direction of lower end surface 4a of lens array 4, bottom surface 12a and all lateral surfaces 12b, 12c and 12d are accommodated within the range defined by the outer shape of opening part 20e. According to this configuration, first concave part 16, second concave part 20 and counterbore part 12 can be formed in a shape that can secure demoldability from molds, so that it is possible to efficiently manufacture lens arrays 4 using molds.

As described above, according to the present embodiment, the convergence effect in first lens surfaces 14 makes it possible to make the monitor-side spot diameter substantially narrower without forming lens surfaces in second refracting surface 21, and the convergence effect in first lens surfaces 14 and the optical path length 28b of the first optical path after reflecting/transmission surface 17 make it possible to further make the fiber-side spot diameter substantially narrower without forming lens surfaces in left end surface 4b of lens array 4. Accordingly, lens surfaces other than first lens surfaces 14 are not required. By this means, it is possible to reliably provide monitor light M and facilitate manufacturing by reducing the number of lens surfaces. Further, according to the present embodiment, it is possible to make the monitor-side spot diameter wider than the fiber-side spot diameter, and, consequently, relax the accuracy to mount photoelectric converting device 2 and further facilitate manufacturing.

Modified Example

Next, a modified example of Embodiment 1 will be explained. With this modified example, the first characteristic, the third characteristic, the surface shape (i.e. flat surface) of left end surface 4b of lens array 4, the surface shape (i.e. flat surface) of second refracting surface 21 and the relationship in width between the fiber-side spot diameter and the monitor-side spot diameter is the same as in FIG. 1, and only the details of the second characteristic are different from the configuration shown in FIG. 1.

That is, the details of the second characteristic according to this modified example include that the optical path length 28b of the first optical path after reflecting/transmission surface 17 (i.e. air conversion length) is formed shorter than the optical path length 23b of the second optical path (i.e. air conversion length), and the proportion of the optical path length 23b of the second optical path with respect to the optical path length 28b of the first optical path after reflecting/transmission surface 17, is equal to or greater than a predetermined value.

With this modified example configured in this way, the relationship in length between the optical path length 23b of the second optical path and the optical path length 28b of the first optical path after reflecting/transmission surface 17 becomes opposite from the configuration shown in FIG. 1.

This modified example can be realized by a configuration in which monitor light M totally reflected on first total reflecting surface 23 is coupled to light receiving elements 8 in a position farther from first total reflecting surface 23 than a position in which the diameter of monitor light M is reduced the most after total reflection (in other words, the focus on the side of an image of the optical system in which optical paths from first lens surfaces 14 to first total reflecting surface 23 are formed). The above-described predetermined value of the proportion of the optical path length 23b of the second optical path with respect to the optical path length 28b of the first optical path after reflecting/transmission surface 17 is a value for specifying that the end of the second optical path 23b according to this modified example is positioned farther than the position in which the diameter of monitor light M is reduced the most.

It is equally possible to embody optical module 1 of this modified example by, for example, arranging light receiving elements 8 in positions spaced apart closer to the direction in which monitor light is totally reflected on first total reflection surface 23, than light receiving elements 8 of optical module 1 shown in FIG. 1. However, in this case, if the direction in which monitor light is totally reflected on first total reflecting surface 23 is not parallel to the direction in which laser light L is emitted from light emitting elements 7, it is necessary to, for example, increase the distance between light emitting elements 7 and light receiving elements 8 more than the distance shown in FIG. 1 to allow laser light L emitted from light emitting elements 7 to be adequately incident on first lens surfaces 14.

With optical module 1 of this modified example configured in this way, it is possible to make the fiber-side spot diameter narrower than the monitor-side spot diameter. Note that, to limit the monitor-side spot diameter within the allowable range utilizing the convergence effect in first lens surfaces 14, a predetermined upper limit value only needs to be set to the above-described proportion of the optical path length 23b of the second optical path with respect to the optical path length 28b of the first optical path after reflecting/transmission surface 17.

Further, the scope of this modified example also includes a configuration of making the optical path length 28b of the first optical path after reflecting/transmission surface 17 shorter by arranging left end surface 4b of lens array 4 farther in the right direction than the position shown in FIG. 1 and arranging optical fibers 3 farther in the right direction than the positions shown in FIG. 1. In case where this configuration is employed, the convergence effect in first lens surfaces 14 only needs to be improved by increasing power of first lens surfaces 14 more than first lens surfaces 14 to limit the fiber-side spot diameter within the allowable range.

According to this modified example configured in this way, the convergence effect in first lens surfaces 14 makes it possible to make the monitor-side spot diameter substantially narrower without forming lens surfaces in second refracting surface 21. Further, thanks to the convergence effect in first lens surfaces 14 and a substantially long optical path length 23b of the second optical path, monitor light M is received in the position farther from first total reflecting surface 23 than the position in which the diameter of monitor light M is reduced the most after monitor light M is totally reflected on first total reflecting surface 23, in a state where monitor light M has a comparatively wider spot diameter than the fiber-side spot diameter, so that it is possible to make the fiber-side spot diameter substantially narrower without forming lens surfaces in left end surface 4b of lens array 4. As a result, according to this modified example, similar to the configuration shown in FIG. 1, lens surfaces other than first lens surfaces 14 are not required.

Embodiment 2

Next, the difference of an optical module according to Embodiment 2 of the present invention from Embodiment 1 will be mainly explained with reference to FIG. 6.

Note that, in the drawings used to explain the present embodiment, the same or similar basic configuration as in Embodiment 1 will be explained using the same reference numerals as in FIG. 1 to FIG. 5.

Figure 6:
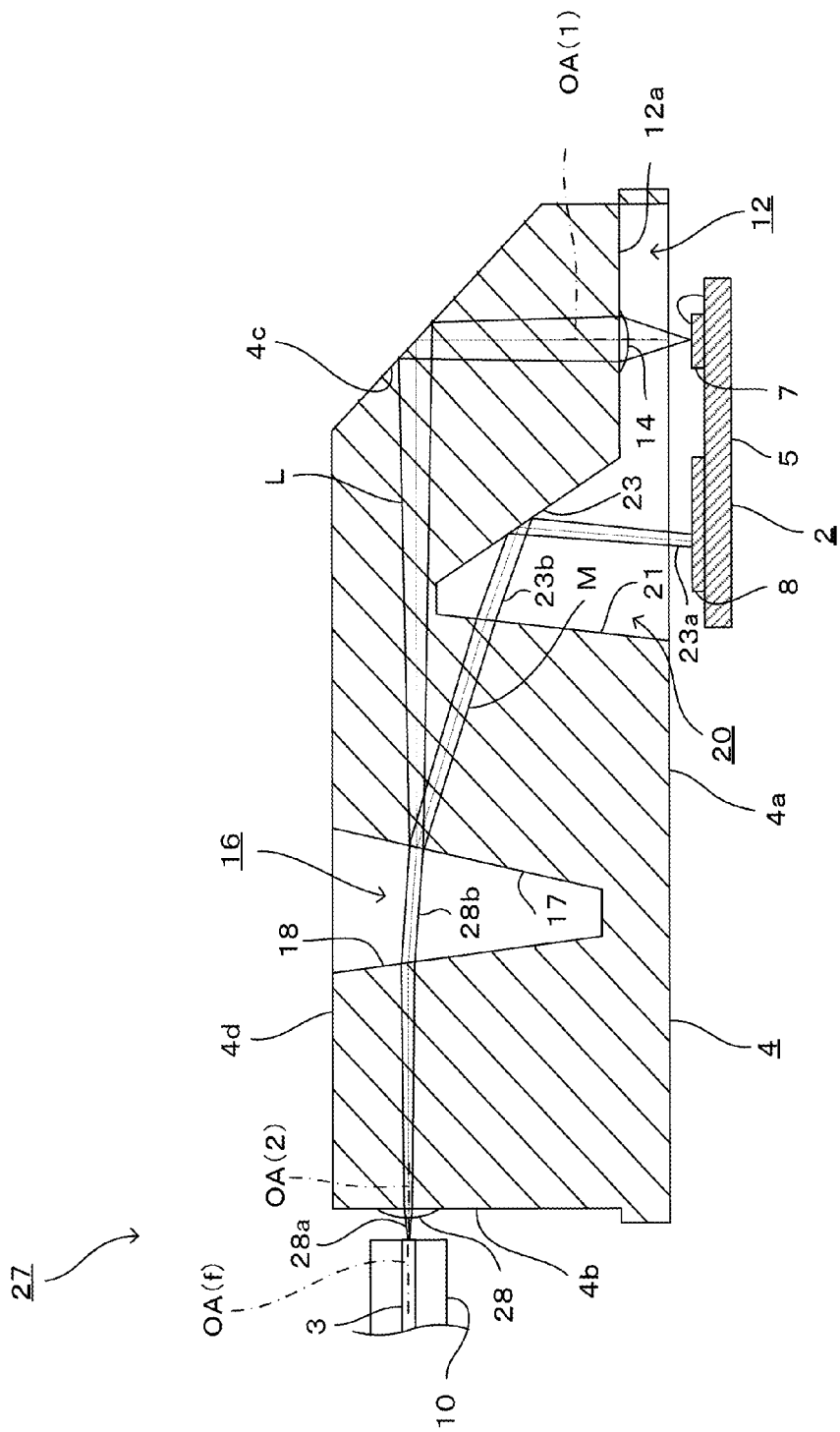
FIG. 6 is a schematic configuration diagram showing an optical module according to an embodiment of the present invention.

As shown in FIG. 6, optical module 27 according to the present embodiment has second lens surfaces 28 (i.e. convex lens surfaces) formed in left end surface 4b of lens array 4 as a component part of lens array 4. Note that the same number of second lens surfaces 28 as first lens surfaces 14 are aligned at the same pitches as first lens surfaces 14 along the same direction as the direction of alignment of first lens surfaces 14. Further, optical axis OA(2) in each second lens surface 28 matches optical axis OA(f) in the end surface of each optical fiber 3 corresponding to each second lens surface 28. On each second lens surface 28, each laser light L (with a spot diameter 28a and an optical path with length 28b), having transmitted through reflecting/transmission surface 17 toward the first optical path 28b and then refracted on first refracting surface 18, is incident from the right in FIG. 6. Then, each second lens surface 28 emits each incident laser light L while converging laser light L toward the end surface of each optical fiber 3. Thus, with the present embodiment, each laser light L is coupled to the end surface of each optical fiber 3 through each second lens surface 28.

Further, with the present embodiment, the details of the second characteristic and the details of the third characteristic are different from Embodiment 1. That is, the details of the second characteristic according to the present embodiment include that the optical path length 28b of the first optical path after reflecting/transmission surface 17, that is, the optical path length 28b from reflecting/transmission surface 17 to the end surface of each optical fiber 3 (i.e. air conversion length) is formed shorter than the optical path length 23b of the second optical path, that is, the optical path from reflecting/transmission surface 17 to each light receiving element 8 (i.e. air conversion length). Further, as described above, the details of the third characteristic according to the present embodiment include that second lens surfaces 28 are formed in left end surface 4b of lens array 4.

Here, with the present embodiment, as described in the second characteristic, the optical path length of the first optical path 28b after reflecting/transmission surface 17 is made shorter than the optical path length 23b of the second optical path, and, therefore, the degree of reduction in the diameter of laser light L in the first optical path after reflecting/transmission surface 17 is less than the configuration shown in FIG. 1 However, with the present embodiment, second lens surfaces 28 are formed in left end surface 4b of lens array 4 (i.e. the third characteristic) according to this second characteristic, so that, even if the diameter of laser light L cannot be substantially reduced in the first optical path after reflecting/transmission surface 17, second lens surfaces 28 can individually converge laser light L. By this means, also with the present embodiment, it is possible to make the fiber-side spot diameter narrower than the monitor-side spot diameter.

The other configurations are the same as in optical module 1 shown in FIG. 1.

Consequently, according to the present embodiment, the convergence effect in first lens surfaces 14 makes it possible to make the monitor-side spot diameter substantially narrower without forming lens surfaces in second refracting surface 21, and the convergence effects in first lens surfaces 14 and second lens surfaces 28 make it possible to further make the fiber-side spot diameter substantially narrower, so that lens surfaces other than first lens surfaces 14 and second lens surfaces 28 are not required.

Modified Example

Next, a modified example of Embodiment 2 will be explained. With this modified example, the first characteristic, the third characteristic, the surface shape (i.e. flat surface) of second refracting surface 21, and the relationship in width between the fiber-side spot diameter and the monitor-side spot diameter are the same as in FIG. 6, and only the details of the second characteristic are different from the configuration shown in FIG. 6.

That is, the details of the second characteristic according to this modified example include that the optical path length of the first optical path after reflecting/transmission surface 17 (i.e. air conversion length) is formed equal to the optical path length of the second optical path (i.e. air conversion length).

Here, with this modified example, although the optical path length of the first optical path after reflecting/transmission surface 17 is formed longer than the optical path shown in FIG. 6, this optical path length does not exceed the optical path length of the second optical path, and, therefore, the degree of reduction in the width of laser light L in the first optical path after reflecting/transmission surface 17 is smaller than the configuration shown in FIG. 1. However, with this modified example, second lens surfaces 28 are formed in left end surface 4b of lens array 4 (i.e. the third characteristic) according to this second characteristic, so that, even if the diameter of laser light L cannot be substantially reduced in the first optical path after reflecting/transmission surface 17, second lens surfaces 28 can individually converge laser light L. By this means, also with the present embodiment, it is possible to make the fiber-side spot diameter narrower than the monitor-side spot diameter.

The other configurations are the same as in optical module 1 shown in FIG. 6.

Consequently, according to this modified example, the convergence effect in first lens surfaces 14 makes it possible to make the monitor-side spot diameter substantially narrower without forming lens surfaces in second refracting surface 21, and the convergence effects in first lens surfaces 14 and second lens surfaces 28 make it possible to further make the fiber-side spot diameter substantially narrower, so that lens surfaces other than first lens surfaces 14 and second lens surfaces 28 are not required.

Note that the present invention is not limited to the above-described embodiments, and can be variously modified where necessary.

INDUSTRIAL APPLICABILITY

The optical module according to the present invention can be used in optical interconnection.

REFERENCE SIGNS LIST

1 OPTICAL MODULE
2 PHOTOELECTRIC CONVERTING DEVICE
3 OPTICAL FIBER
4 LENS ARRAY
5 OPTICAL FIBER
7 LIGHT EMITTING ELEMENT
8 LIGHT RECEIVING ELEMENT
14 FIRST LENS SURFACE
16 FIRST CONCAVE PART
17 REFLECTING/TRANSMISSION SURFACE
20 SECOND CONCAVE PART
23 FIRST TOTAL REFLECTING SURFACE

The invention claimed is:
1. An optical module comprising:
a photoelectric converting device including a plurality of light emitting elements arranged therein for emitting light and at least one light receiving element for receiving monitor light for monitoring light emitted from at least one of the light emitting elements;
a plurality of optical fibers corresponding to the light emitting elements; and
a lens array arranged between the photoelectric converting device and the optical fibers for optically coupling the light emitting elements and end surfaces of the optical fibers, wherein, in a first surface of the lens array facing the photoelectric converting device, a plurality of first lens surfaces aligned with a predetermined alignment direction corresponding to the light emitting elements for receiving light emitted from the light emitting elements, and having a number the same as that the light emitting elements;

in the lens array, a first concave part which is recessed and is positioned on a first optical path connecting the light emitting elements and the end surfaces of the optical fibers;

a reflecting/transmission surface forms a part of a lateral surface of the first concave part for reflecting light incident on the first lens surfaces, at a predetermined reflectivity and allowing transmission of the light at a predetermined transmittance while refracting the light toward the first optical path, and, upon the transmission, branching light incident on at least one of the first lens surfaces, from the first optical path as the monitor light to reflect the monitor light toward a second optical path leading to the light receiving elements;

in the lens array, a second concave part is recessed and positioned on the second optical path;

an emitting surface forms a part of a lateral surface of the second concave part for emitting the monitor light incident from the reflecting/transmission surface to an inside space formed by the second concave part;

a first total reflecting surface is formed in other part of a lateral surface of the second concave part for totally reflecting the monitor light emitted from the emitting surface toward the light receiving elements;

light incident on the first lens surfaces after being transmitted through the reflecting/transmission surface toward the first optical path is produced and emitted from a second surface facing the end surfaces of the optical fibers in the lens array to the end surfaces of the optical fibers;

a surface shape of the first lens surfaces is formed in a surface shape for converging light incident from each of the light emitting elements;

the emitting surface is formed in a flat surface; and a spot diameter of light emitted from each of the light emitting elements to be coupled to each of the end surfaces of the optical fibers becomes smaller than a spot diameter of the monitor light to be coupled to the light receiving elements according to the surface shape of the first lens surfaces, a relationship between an optical path length of the second optical path and an optical path length of the first optical path after the reflecting/transmission surface, and whether a plurality of second lens is formed in the second surface surfaces for emitting and converging light incident on the first lens surfaces toward the end surfaces of the optical fibers.

2. The optical module according to claim 1, wherein:
the optical path length of the first optical path after the reflecting/transmission surface is formed longer than the optical path length of the second optical path; and
the second surface is formed in a flat surface without the second lens surfaces.

3. The optical module according to claim 1, wherein:
the optical path length of the first optical path after the reflecting/transmission surface is shorter than the optical path length of the second optical path and a proportion of the optical path length of the second optical path with respect to the optical path length of the optical path after the reflecting/transmission surface is equal to or greater than a predetermined value; and
the second surface is formed in a flat surface without the second lens surfaces.

4. The optical module according to claim 1, wherein:
the optical path length of the first optical path after the reflecting/transmission surface is equal to the optical path length of the second optical path; and
the second lens surfaces are formed in the second surface.

5. The optical module according to claim 1, wherein:
the optical path length of the first optical path after the reflecting/transmission surface is shorter than the optical path length of the second optical path; and
the second lens surfaces are formed in the second surface.

6. The optical module according to claim 1, wherein the light receiving elements are arranged at positions closer to the first concave part than the light emitting elements, a second total reflecting surface which totally reflects light incident on the first lens surfaces toward the first concave part is formed in the lens array, and the second concave part is arranged at a position closer to the first concave part than the first lens surfaces and the second total reflecting surface and away from the first optical path not reaching the reflecting/transmission surface, so that the first optical path not reaching the reflecting/transmission surface is formed so that the first optical path does not cross the second optical path.

* * * * *